United States Patent [19]
Ugon et al.

[11] Patent Number: 4,538,058
[45] Date of Patent: Aug. 27, 1985

[54] POWER SUPPLY SYSTEM OF A DEVICE DESIGNED TO COOPERATE WITH A REMOVABLE ELECTRONIC MEDIUM SUCH AS A CARD AND DEVICE EQUIPPED WITH SUCH A SYSTEM

[75] Inventors: Michel Ugon, Maurepas; Serge Fouchard, Plaisir, both of France

[73] Assignee: Cii Honeywell Bull (Societe Anonyme), Paris, France

[21] Appl. No.: 486,670

[22] Filed: Apr. 20, 1983

[30] Foreign Application Priority Data

May 5, 1982 [FR] France .................. 82 07773

[51] Int. Cl.³ .............................................. G06K 5/00
[52] U.S. Cl. ............................... 235/380; 371/66
[58] Field of Search .............. 364/408; 371/66; 235/380

[56] References Cited

U.S. PATENT DOCUMENTS

| | | | |
|---|---|---|---|
| 4,211,919 | 7/1980 | Ugon | 235/487 |
| 4,256,955 | 3/1981 | Giraud et al. | 235/380 |
| 4,277,837 | 7/1981 | Stuckert | 364/408 |
| 4,451,742 | 5/1984 | Aswell | 371/66 |

OTHER PUBLICATIONS

IBM Tech. Discl. Bull., vol. 23, No. 3, Aug. 1980, Battery Backup Power Supply, T. Winlow.
Design News, 2119, E.D.N. Electrical Design News (1981) Sep., No. 18, Boston, U.S.A., Dan Garcia.
IBM Technical Disclosure Bulletin, vol. 21, No. 4, Sep. 1978, UPS Reserve Time Predictor, M. E. Houdek.

*Primary Examiner*—Harold I. Pitts
*Attorney, Agent, or Firm*—Kerkam, Stowell, Kondracki & Clarke

[57] ABSTRACT

The invention relates to a power supply system for a device designed to cooperate with a portable electronic medium, e.g., a credit or identification card having integrated electronic circuits therein. This system comprises a main power supply circuit (5a) that applies at least one voltage (V) to a processing unit (3) by means of a main supply source (6a) and an auxiliary backup supply circuit (5b) by means of an auxiliary supply source (6b). A detector circuit (7) detects any anomaly of the main source (6a) and automatically connects the auxiliary source (6b) in order to apply the voltage (V) to the unit (3).

The invention is more particularly applicable to the supply of a transaction terminal or unit which cooperates with portable electronic mediums, e.g., credit or identification cards.

12 Claims, 3 Drawing Figures

POWER SUPPLY SYSTEM OF A DEVICE DESIGNED TO COOPERATE WITH A REMOVABLE ELECTRONIC MEDIUM SUCH AS A CARD AND DEVICE EQUIPPED WITH SUCH A SYSTEM

BACKGROUND OF THE INVENTION

1. Field of the Invention

The invention generally relates to a power supply system of a device designed to cooperate with at least one portable electronic carrier, such as a credit or identification card or the like, and is more particularly concerned with a power supply system that allows a possible failure within the power source of the device to be overcome, especially during processing operations between the device and a card connected thereto.

2. Description of the Prior Art

Presently, numerous systems or devices exist that are provided with processing means and with 2-way communication means with portable electronic carriers, such as credit or identification cards or the like, capable of memorizing information in a non-volatile fashion. These systems are at least designed for reading and/or writing information into the cards and processing this information according to the applications covered by the cards. Such systems are particularly described in U.S. Pat. No. 4,211,919 (Cii/HB Case 2141).

CROSS REFERENCE TO RELATED APPLICATIONS

For a better understanding of the subject matter of this application, reference may be made to (Cii/HB Case 2372) U.S. application for patent, Ser. No. 200,785; (Cii/HB Case 2269) U.S. application for patent, Ser. No. 262,607; (Cii/HB Case 2141) U.S. Pat. No. 4,211,919 and (Cii/HB Case 2235) U.S. application for patent Ser. No. 207,463. The subject matter of each patent and applications are hereby incorporated by reference.

Systems incorporating non-volatile memories require for their operation a power or supply source to feed a main supply circuit charged with distributing the various voltages needed for the electronic components making up these systems. Such systems have at least two drawbacks with respect to their power supply. A first shortcoming appears when there is a cutoff in the supply caused within the power source, particularly during write operations in the card. A second shortcoming, which is a consequence of the first, appears after such a cutoff because after the power source has been reestablished, the system cannot resume its normal course of previously interrupted operations.

These drawbacks are particularly important in pay devices such as banking or other terminals using electronic cards, particularly when the supply happens to fail in the course of a transaction, especially when this transaction involves write operations in the card. Such write operations frequently last several hundreds of milliseconds, even several seconds. Consequently, a cutoff in the supply will result in stopping all these operations in a completely indeterminate state and is often detrimental to the normal resumption of subsequent operations, either on the same or on another piece of apparatus.

These drawbacks are all the more important, as the cut-off moment of the supply occurs in absolutely random fashion and this moment can be preceded or followed by an uncontrollable behavior or action by the system.

SUMMARY OF THE INVENTION

Therefore, the invention proposes a power supply system for a device designed to cooperate with at least one portable electronic medium, such as a card, said device comprising at least processing circuits for processing data recorded in a memory of the card, said system comprising a main supply circuit which applies at least one voltage (V) by means of a main supply source. The invention is particularly characterized in that in order to make up for any failure of the supply source, especially during the transfer of data between the processing circuits of the unit and the card, the system comprises an auxiliary safeguard or protective backup supply circuit which can be switched automatically and which generates said voltage (V) by means of an auxiliary supply source.

BRIEF DESCRIPTION OF THE DRAWINGS

Other characteristics, advantages and details of the invention will become apparent from the ensuing explanatory description with reference to the accompanying drawings given solely by way of example and wherein.

DESCRIPTION OF THE PREFERED EMBODIMENTS

Figure 1:
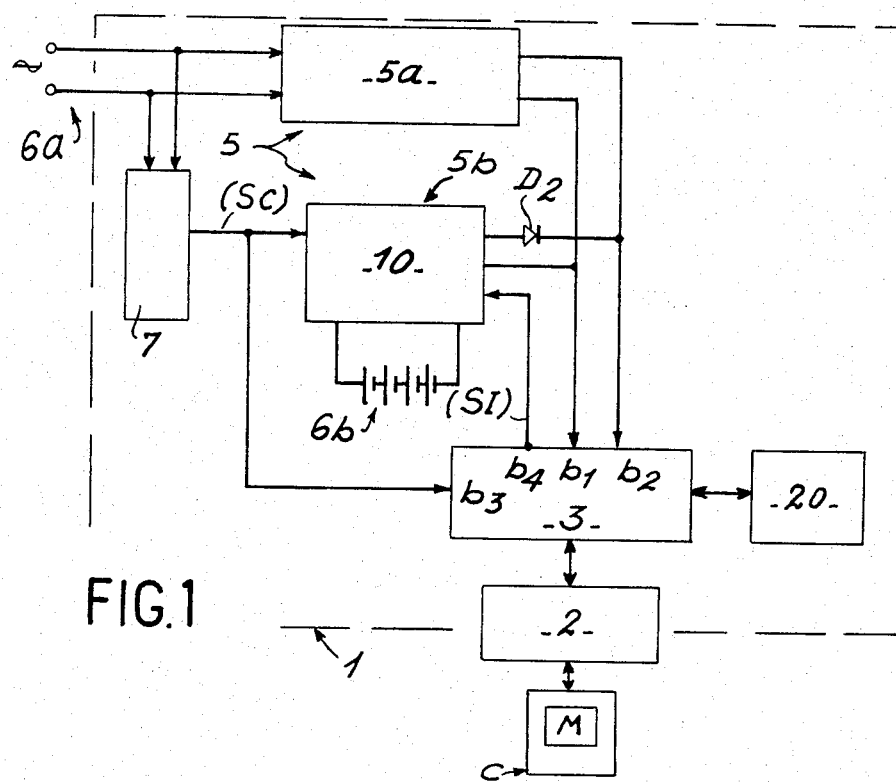
FIG. 1 is a schematic diagram of a transaction unit or terminal to which a card is connected and which is provided with a supply system comprising a main supply circuit and an auxiliary supply circuit embodying the invention.

With reference to FIG. 1, a unit (1) hereinafter called transaction unit, is designed to communicate with at least one portable electronic medium such as a card (C).

This card (C) comprises at least one memory (M) capable of storing information in a non-volatile fashion. Depending on the applications intended for the card (C), the latter can be especially designed on the basis of characteristics such as broadly described in French Pat. No. 2,337,371 and aforementioned U.S. application Ser. No. 207,463 (Cii/HB 2235).

The card (C) is connected to the transaction unit (1) by means of a coupler (2) assuring the number of functions necessary for the dialog between the card (C) and the transaction unit (1). Such a coupler (2) is particularly described in U.S. patent application Ser. No. 302,595, the subject matter of which is hereby incorporated by reference.

To facilitate an understanding of the invention, the details of the transaction unit (1) have been voluntarily limited to processing circuits grouped together in a data processing unit (3). Data can be read from the memory (M) of the card (C) or written into said memory (M) or also, after reading of the memory (M), transmitted to a central unit if the transaction unit (1), for example, forms part of a network.

Needless to say, such a transaction unit (1) can only function by means of a power supply system consisting of a supply circuit fed by a supply source usually external to the transaction unit to generate the operating voltage(s) needed by the various circuits constituting the transaction unit (1).

The supply system (5) shown in FIG. (1) consists of a conventional main power supply circuit (5a) supplied, for example, by means of a main voltage source (6a), such as the main supply, and an auxiliary safeguard or protective backup supply circuit (5b) supplied by means of an auxiliary voltage source (6b), such as a battery.

The main power supply circuit (5a) is conventional and may, for instance, consist of a rectifier or other known arrangement for removal of part of the positive-going half-cycle of an a-c power-supply waveform by the action of silicon—controlled rectifier(s), or another type of supply, more particularly of the series-regulation type.

The voltage (V) generated at the output of the main supply circuit (5a) is, for example, applied to the terminals (b1 and b2) of the processing unit (3) so as to supply power to the various circuits making up said unit.

The auxiliary backup supply circuit (5b) is designed to generate at the output the same voltage (V) mentioned above at the terminals (b1 and b2) of the processing unit (3). The auxiliary backup supply circuit (5b) is controlled by a detector circuit (7) which checks the presence of absence of the supply voltage generated by the source (6a) supplying the main supply circuit (5a).

A detailed description will now be given of the detector circuit (7) and of the auxiliary backup supply circuit (5b) in conjunction with FIGS. 2 and 3, respectively.

The detector circuit (7) consists, for example, of a photocoupler (8) such as phototransistor, which also assures the isolation between the main supply and the rest of the system.

The phototransistor (8) is followed by a maintenance circuit consisting of a diode ($D_1$) and a capacitor ($C_1$). The output of the maintenance circuit ($D_1$, $C_1$) derived between the diode ($D_1$) and the capacitor ($C_1$) is applied to the negative input of a differential amplifier (9) whose positive input terminal is connected to ground. This amplifier (9) plays the role of a control circuit by delivering at the output a control signal (SC) in the absence of the mains supply, as will be explained hereinbelow.

The auxiliary backup supply circuit (5b) in FIG. (3) is, for example, supplied by means of source (6b) consisting of a battery. This circuit (5b) consists, for example, of a threshold regulator or controller (10), one input of which is connected to the battery (6b) via a relay (I) diagrammed schematically by a switch and whose function will be explained hereinbelow.

The tripping threshold of the controller (10) is regulated by a resistive divider bridge composed of a variable resistor ($R_1$) and resistor ($R_2$). The control signal (SC) coming from the detector circuit (7) is applied via a diode ($D_3$) to the connecting point (L) between the two resistors ($R_1$) and ($R_2$). The output of the controller (10) decoupled by a capacitor ($C_2$) is applied via a diode ($D_2$) to the terminals ($b_1$) and ($b_2$) of the processing unit (3).

The control signal (SC) is likewise applied to an input terminal of a logic "OR" gate (12) whose output signal controls the opening and closing of the switch (I). The control signal (SC) is also applied to a timing circuit (13) consisting of a series connected resistor ($R_4$) and capacitor ($C_4$), the capacitor having one end connected to ground and the resistor having one and connected to a positive supply terminal (+). The timing circuit (13) is preceded by a buffer amplifier (14) and followed by a buffer amplifier (15). More specifically, the control signal (SC) is applied to the negative input of the amplifier (14) whose positive input terminal is connected to ground. The output of the amplifier (14) is connected via a diode ($D_4$) to the connecting or junction point (M) between the resistor ($R_4$) and the capacitor ($C_4$). This connecting point (M) is also connected to the negative input terminal of the amplifier (15) whose positive input terminal is connected to ground. The output of the amplifier (15) is connected to the aforesaid connecting point (L) via a diode ($D_5$). Finally, the control signal (SC) is also applied to a terminal ($b_3$) of the processing unit (3).

The operation of the supply system whose constitutent elements have just been described with reference to FIGS. 1 to 3 will now be explained.

During normal operation, the main supply circuit (5a), supplied by the source (6a) applies to the transaction unit (1) the voltage(s) required for the operation of said unit. In the example shown, suppose that the main supply circuit (5a) applies a voltage (V) to the terminals ($b_1$), ($b_2$) of the processing unit (3) of the transaction unit (1). The auxiliary backup supply circuit (5b) is then inactive, which is translated by the open position of the switch (I) (FIG. 3). It is important to note that the presence of the switch (I) between the battery (6b) and the controller (10), when in the open position, prevents a discharge of the battery through the controller (10).

If the detector circuit (7) (FIG. 2) detects the presence of the main supply, the amplifier (9) does not apply any control signal (SC). Under these conditions, the transaction unit (1) can perform all the functions with which it is charged with respect to a card (C) connected to the unit (1) by means of the coupler (2). These functions are usually translated by data write and read operations in the memory (M) of the card (C).

Let us now suppose that an anomaly presents itself within the main supply source (6a), which anomaly is translated by an interruption in the supply of the processing unit (3).

Figure 2:
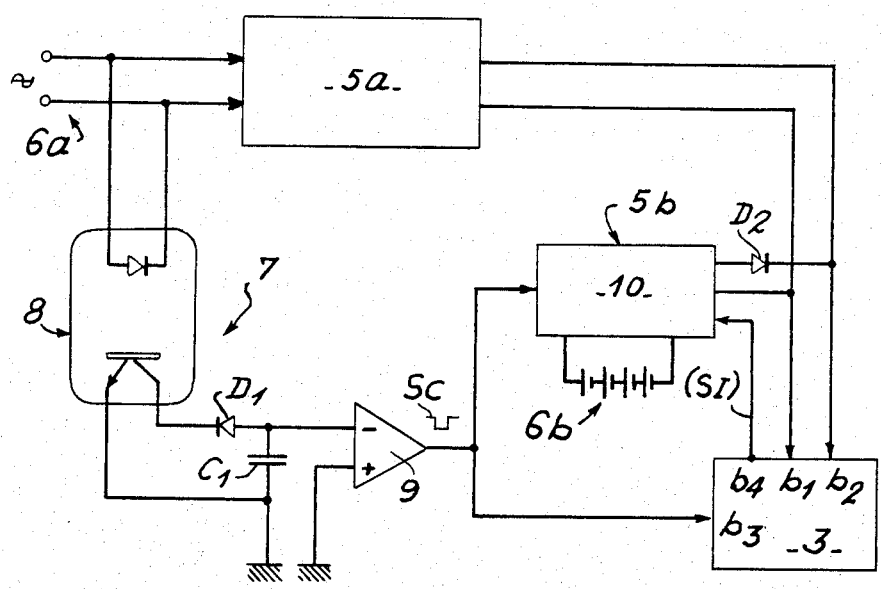
FIG. 2 shows the details of a detector circuit diagrammed schematically in FIG. 1 and whose function is to detect a failure in the main supply circuit.
Figure 3:
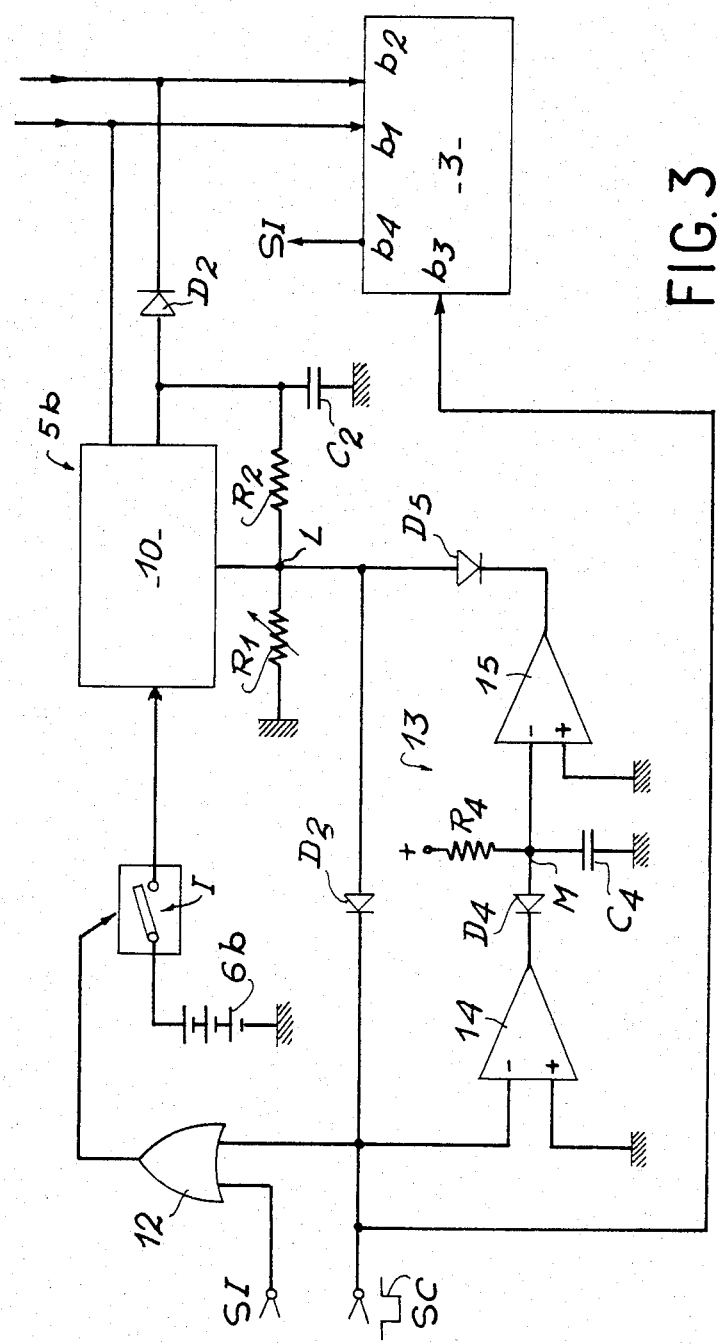
FIG. 3 shows the details of the auxiliary backup supply circuit diagrammed schematically in FIG. 1 and controlled by the detector circuit in FIG. 2.

The detector circuit (7) will detect this interruption and applies the control signal (SC) to the output of the amplifier (9) (FIG. 2). More specifically, the voltage applied by the phototransistor (8) and previously applied to the maintenance circuit ($D_1$, $C_1$), no longer exists, which causes the capacitor ($C_1$) to be discharged. A discharge impulse is then created, which is applied to the negative input terminal of the differential amplifier (9). This causes the amplifier (9) to apply a control signal (SC) which will be delivered simultaneously to the OR gate (12) and to the controller (10), the timing circuit (13) and the terminal ($b_3$) of the processing unit (3).

The control signal (SC) applied to the "OR" gate (12) and transmitted by the latter, will cause the closing of the switch (I) in order to connect the battery (6b) to the controller (10). At the same time, this control signal (SC) will cause, via the diode ($D_3$), the tripping of the controller (10) so that the latter will apply a stabilized voltage by means of the battery (6b) and through the diode ($D_2$). This stabilized voltage, which is equal to the voltage (V) previously supplied by the main supply circuit (5a), allows the terminals ($b_1$) and ($b_2$) of the processing unit (3) to be resupplied instantly and automatically in order to permit the latter to continue the operations which may be in progress with the card (C).

The control signal (SC) is also applied to the timing circuit ($R_4$, $C_4$) and thus causes the capacitor ($C_4$) to be charged. Once this capacitor ($C_4$) is charged, it will discharge and will produce an impluse which will be transmitted by the amplifier (15) to the controller (5b) so as to block it, which will cause the auxiliary supply source (6b) to be cut off. It stands to reason that this blocking will only occur after a predetermined time depending on the discharge time of the capacitor ($C_4$). This predetermined timing must be sufficient to permit the end of the operations in progress in the processing unit (3) after cut-off of the main supply circuit (5a).

The control signal (SC) is also applied to the terminal (b3) of the processing unit (3) to inform it of the substitution between the two power sources (6a) and (6b). In return, the processing unit (3) can advise through a signal (SI) or interrupt signal that the operation(s) in progress with the card (C) is (are) terminated.

This interrupt signal (SI), derived from the terminal (b4) of the processing unit (3) is, for example, applied to the second input of the logic OR gate (12) in order to open the switch (I) and thus to disconnect the auxiliary supply source (6b) before the aforementioned timing period expires.

Preferably, the switch (I), which functions as a conventional cut-off device, consists of a relay (e.g., electromechanical), and is excited by the control signal (SC) and kept closed by means of the auxiliary backup supply source (5b) as soon as there is a cut-off in the main circuit (5a).

Under these conditions, the relay will be reopened either, as described earlier, by the interrupt signal (SI) transmitted by the processing unit, or by disconnecting the auxiliary backup supply circuit (5b), in the absence of the interrupt signal (SI), after expiration of the timing period fixed by the timing circuit (13).

Now, reverting to FIG. 1, the processing unit (3) is connected to a memory of storage unit (20), which may be a non-volatile memory, and which is appropriately utilized at the cut-off instant of the main supply source (6a) in order to protect or safeguard the data necessary for resumption of the data processing and of the data communication with the card (C) when the source (6a) will have been restored.

More particularly, the following parameters are involved:
The contents of the operation registers of the processing unit (3);
The status of the operations and computations in progress;
The address of the interrupted program;
The main characteristics of the card (C);
The data memorized by the coupler (2), etc. . . .

When the main source (6a) has been restored, the intitialization program of the system will analyze in the non-volatile memory (20) a "status word" which allows one to know the state in which the system found itself prior to the interruption. Advantageously, this memory (20) can be removable.

Within the spirit of the invention, the detector circuit (7) plays a role of prime importance and this circuit can control devices other than those for safeguard or protective backup supply and it is intended by the appended claims to cover all such devices and systems which come within the true spirit of the invention.

We claim:
1. A transaction terminal adapted to cooperate with a portable electronic medium such as a credit card or the like having a non-volatile memory and a first processing circuit, said terminal comprising a second processing circuit for processing data recorded in the memory of the card, the first and second processing circuits being adapted to transfer data therebetween to permit transactions between the terminal and the card; a main supply circuit connected to a main power source for generating a first voltage and for supplying the first voltage to the processors of the terminal and the card; first means for compensating for failure of the main power source, especially during said transfer of data, said first means comprising a backup power supply circuit adapted to be connected to an auxiliary power source for generating a second voltage corresponding to the first voltage; a detector circuit for monitoring the main power source and for generating a control signal upon failure of the main power source during a transaction; second means responsive to the control signal for automatically connecting the auxiliary power source to the backup power supply circuit and for causing the backup power supply circuit to apply the second voltage to the card; and a timing circuit responsive to the control signal for controlling the second means so as to maintain said second voltage applied to the card for a predetermined period of time after said failure sufficient to enable a transaction in progress to be completed and for thereafter disabling the backup power supply circuit and disconnecting the backup power supply circuit from the auxiliary power source.

2. The terminal of claim 1, wherein said second means comprises switching means disposed between the auxiliary power source and the backup power supply circuit, the switching means being controlled by said control signal.

3. The terminal of claim 2, wherein said switching means comprises a switch, and a logic OR gate having an output connected to the switch and being responsive to the control signal for opening and closing the switch.

4. The terminal of claim 3, wherein said switch comprises a relay connected to the auxiliary power source and to the OR gate so as to be closed upon the control signal being applied to the OR gate and to be maintained in closed position by the auxiliary power source.

5. The terminal of claim 4, wherein said control signal is applied to said second processing circuit, and said second processing circuit includes means for producing an interrupt signal upon completion of a transaction which was in progress upon the control signal being received, the OR gate being responsive to said interrupt signal for causing said relay to open and disconnect the auxiliary power source from the backup power supply circuit.

6. The terminal of claim 1, wherein said detector circuit comprises a photocoupler connected to the main power source and arranged to produce a third voltage when the main power source is operating normally, and third means connected to an output of the photocoupler for receiving the third voltage and for producing said control signal upon the third voltage changing from a predetermined level.

7. The terminal of claim 6, wherein said third means comprises a capacitor connected to the output of the photocoupler through a diode and connected to one terminal of a differential amplifier, another terminal of said differential amplifier being connected to ground, and the control signal being produced at the output of said differential amplifier.

8. The terminal of claim 1, wherein said backup power supply circuit comprises a threshold controller formed to supply a stabilized output voltage from said auxiliary power source, said output voltage being said second voltage, the controller being tripped by said control signal so as to supply the second voltage to the card.

9. The terminal of claim 8, wherein the threshold of said controller is determined by a divider bridge comprising two resistors connected in series, and said control signal is applied to a junction of the two resistors.

10. The terminal of claim 9, wherein the timing circuit comprises a capacitor disposed beteen first and second buffer amplifiers, the first buffer amplifier receiving the control signal and causing the capacitor to discharge for said predetermined period of time, the second buffer amplifier having an output connected to the junction of said resistors of the threshold controller and to said second means for disconnecting the auxiliary power source from said controller and for inhibiting the operation of said controller after said predetermined period of time.

11. The terminal of claim 1, wherein said terminal further comprises another memory connected to the second processing circuit for storing data necessary for resumption of normal data processing upon correction of a main power source failure.

12. The terminal of claim 11, wherein said other memory comprises a non-volatile memory which is removably coupled to the terminal.

* * * * *